(12) United States Patent
Tsai et al.

(10) Patent No.: US 7,291,927 B2
(45) Date of Patent: Nov. 6, 2007

(54) DUAL CHIPS STACKED PACKAGING STRUCTURE

(75) Inventors: Chen-Jung Tsai, Hsinchu (TW); Chih-Wen Lin, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/726,577

(22) Filed: Dec. 4, 2003

(65) Prior Publication Data

US 2005/0001328 A1  Jan. 6, 2005

(30) Foreign Application Priority Data

Jun. 20, 2003  (TW) ................ 92116766 A

(51) Int. Cl.
  *H01L 23/48* (2006.01)
  *H01L 23/52* (2006.01)
  *H01L 29/40* (2006.01)
  *H01L 23/28* (2006.01)

(52) U.S. Cl. .............. 257/778; 257/777; 257/787; 257/690; 257/693; 257/E27.137; 257/E27.144; 257/E27.161

(58) Field of Classification Search ............... 257/676, 257/687, 690, 693, 700, 777, 784, 778, 787, 257/E27.137, E27.144, E27.161
See application file for complete search history.

(56) References Cited

U.S. PATENT DOCUMENTS

| 5,793,101 A | * | 8/1998 | Kuhn | 257/676 |
| 5,861,668 A | * | 1/1999 | Cha | 257/692 |
| 6,163,076 A | * | 12/2000 | Lee et al. | 257/777 |
| 6,404,044 B2 | * | 6/2002 | Akram et al. | 257/686 |
| 6,489,668 B1 | * | 12/2002 | Oda et al. | 257/675 |
| 6,503,776 B2 | | 1/2003 | Pai et al. | |
| 6,541,846 B2 | * | 4/2003 | Vaiyapuri | 257/676 |
| 6,563,205 B1 | * | 5/2003 | Fogal et al. | 257/686 |
| 6,603,072 B1 | * | 8/2003 | Foster et al. | 174/52.4 |
| 2003/0214048 A1 | * | 11/2003 | Wu et al. | 257/777 |
| 2004/0000723 A1 | * | 1/2004 | Egawa | 257/777 |
| 2004/0061202 A1 | * | 4/2004 | Shim et al. | 257/666 |

FOREIGN PATENT DOCUMENTS

| TW | 461057 B | 10/2001 |
| TW | 478127 B | 3/2002 |

* cited by examiner

*Primary Examiner*—Jerome Jackson
*Assistant Examiner*—Jesse A. Fenty
(74) *Attorney, Agent, or Firm*—Birch, Stewart, Kolasch & Birch, LLP

(57) ABSTRACT

A dual chips stacked packaging structure. A first chip comprises an active surface and an opposing non-active surface, the active surface consisting of a central area and a peripheral area having a plurality of first bonding pads. A lead frame comprises a plurality of leads and a chip paddle having a first adhering surface and a second adhering surface, with the first adhering surface adhering to the active surface of the first chip in such a way as to avoid contact with the first bonding pads. A second chip comprises an active surface and an opposing non-active surface connecting with the second adhering surface of the chip paddle, and the active surface consisting of a central area and a peripheral area having a plurality of second bonding pads. Parts of the wires electrically connect with the first bonding pad and the leads, and parts of the wires electrically connect with the second bonding pad and the leads.

23 Claims, 4 Drawing Sheets

DUAL CHIPS STACKED PACKAGING STRUCTURE

This Non-provisional application claims priority under 35 U.S.C. § 119(a) on Patent Application No(s). 92116766 filed in Taiwan on Jun. 20, 2003, the entire contents of which are hereby incorporated by reference.

BACKGROUND OF THE INVENTION

1. Field of the Invention

The present invention relates to a semiconductor packaging structure and in particular to a dual chips stacked semiconductor packaging structure.

2. Description of the Related Art

In recent years, packaging has become a performance-limiting factor for microelectronic devices, with size, weight, cost, pin count, and power consumption assuming importance in packaging design. Packaging design must generally trade off between material, structure, and electronic property considerations to obtain a cost-effective and reliable design.

Conventional stacked semiconductor packaging structure, as shown in FIG. 1, one side of a chip paddle 2 of a lead frame is usually attached to the non-active surface of the first chip 1, with the opposite side attached to the of the second chip 3 by using the epoxy or other adhesive. Wires 5 connect with the leads 4 and the bonding pads 6 deposited on the first chip 1 and the second chip 2. The resulting structure is then encapsulated by a molding compound 7, thus completing the package. It is difficult to integrate the first chip 1 and the second chip into the packaging structure since the active surfaces of the fist chip and the second chip are opposite each other. Moreover, the total thickness of the stacked packaging structure is thick.

Another conventional stacked semiconductor packaging structure is shown in FIG. 2. A spacer 30 is disposed between the first chip 100 and the second chip 20. The active surfaces of the first chip 10 and the second chip 20 face the same direction. However, the total thickness of the stacked semiconductor packaging structure as mentioned above is still overly thick. Furthermore, the stacked semiconductor packaging structure is asymmetrical, affecting reliability.

SUMMARY OF THE INVENTION

Accordingly, an object of the invention is to provide a dual chips stacked packaging structure to assemble two chips facing the same direction, compatible with the current products, to simplify packaging and reduce costs.

It is another object of the invention to provide a dual chips stacked packaging structure with reduced total thickness.

To achieve the above objects, the present invention provides a dual chips stacked packaging structure comprising a first chip, a lead frame, a second chip, and a plurality of wires. The first chip comprises an active surface and an opposing non-active surface, the active surface consisting of a central area and a peripheral area having a plurality of first bonding pads. The lead frame comprises a plurality of leads and a chip paddle having a first adhering surface and a second adhering surface, wherein the first adhering surface is adhered to the active surface of the first chip in such a way as to avoid contact with the first bonding pads. A second chip comprises an active surface and an opposing non-active surface connecting with the second adhering surface of the chip paddle, wherein the active surface consists of a central area and a peripheral area having a plurality of second bonding pads. As well, parts of the wires electrically connect with the first bonding pad and the leads, and parts of the wires electrically connect with the second bonding pad and the leads.

The first adhering surface of the chip paddle and the active surface of the first chip are connected by a non-conductive solid or liquid adhesive.

The second adhering surface of the chip paddle and the non-active surface of the second chip are connected by a solid or liquid adhesive. Further, the wires can be metal.

Each lead has a connecting surface and non-connecting surface.

The structure of further comprises an encapsulation, covering the lead frame, the first chip, the second chip, the wires, and the non-connecting surface of each lead.

The arrangement of the encapsulation can be modified in several ways.

In one modification, the encapsulation covers the second chip, the chip paddle, the connecting surface of each lead, the wires, and the active surface of the first chip, exposing the opposing non-active surface of the first chip and the non-connecting surface of each lead.

Each lead further comprises an inner lead covered by the encapsulation and outer lead extending beyond the encapsulation.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

The present invention is now described with reference to the figures.

First Embodiment

Figure 1:
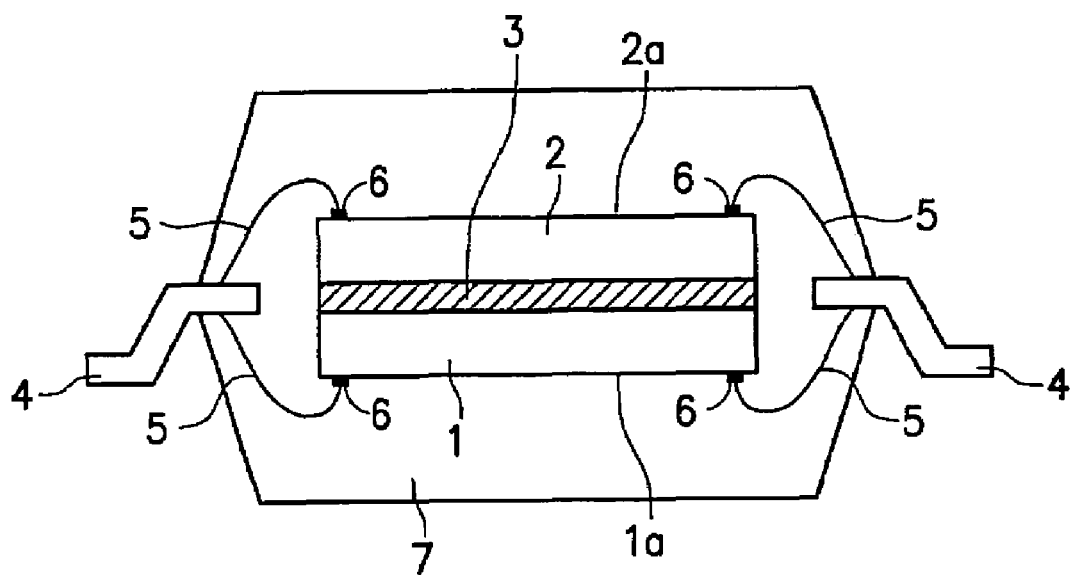
FIG. 1 is a cross-section of a conventional stacked semiconductor packaging structure.
Figure 2:
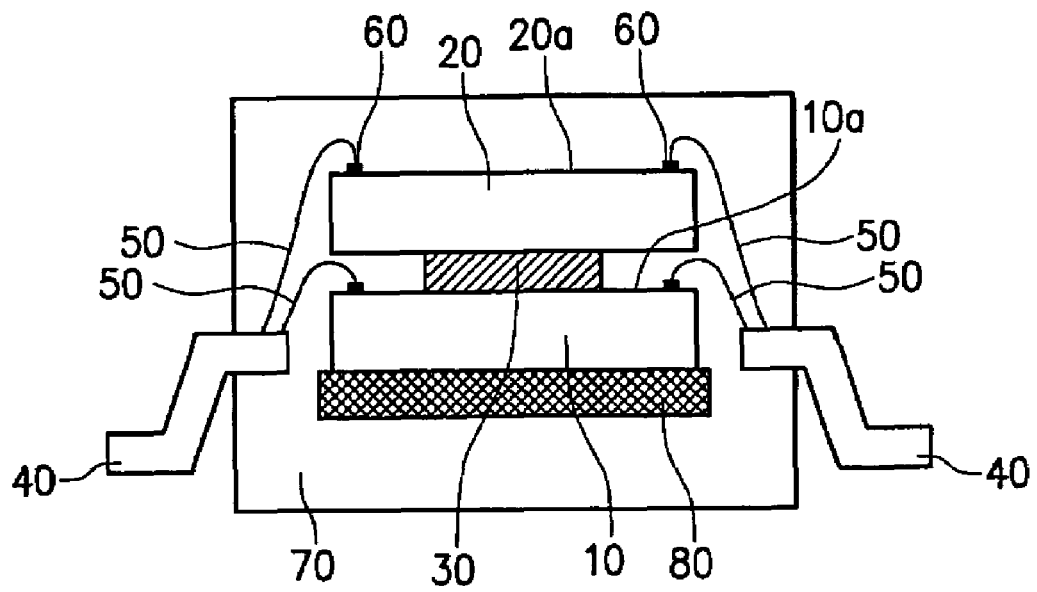
FIG. 2 is a cross-section of another conventional stacked semiconductor packaging structure.
Figure 3:
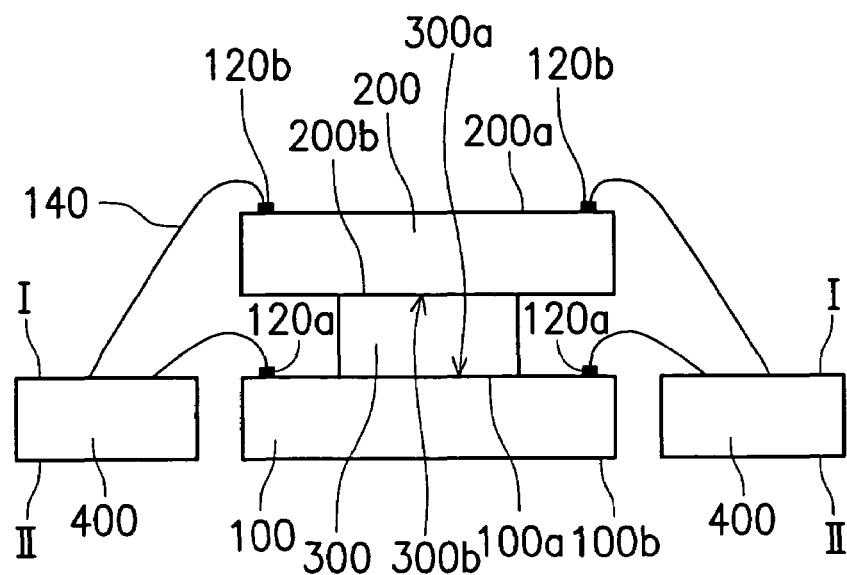
FIG. 3 is a cross-section of a dual chips stacked packaging structure according to a first embodiment of the invention.

In FIG. 3, a dual chips stacked packaging structure according to the present invention is shown. A first chip 100 comprises an active surface 100a and an opposing non-active surface 100b, the active surface 100a consisting of a central area and a peripheral area, on which a plurality of first bonding pads 120a is arranged.

Figure 4:
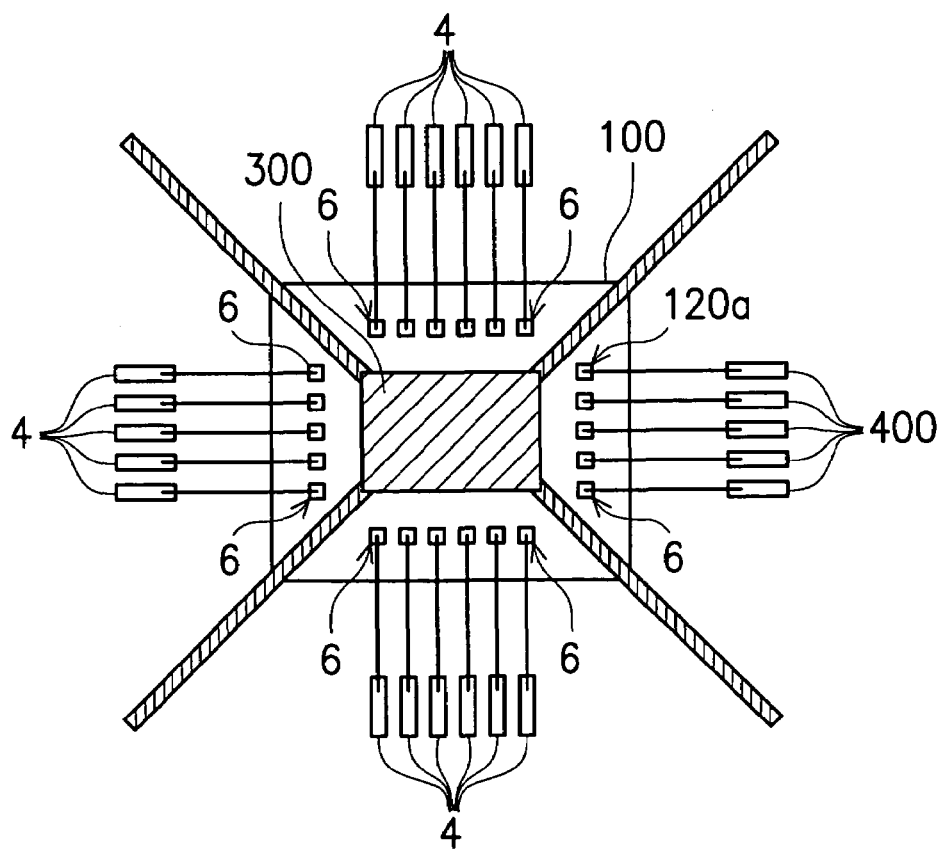
FIG. 4 is a top-view of the first level of the dual chips stacked packaging structure of FIG. 3.

A lead frame comprises a plurality of leads 400 and a chip paddle 300 having a first adhering surface 300a and a second adhering surface 300b. The first adhering surface 300a of the chip paddle 300 is adhered to the active surface 100a of the first chip 100 in such a way as to avoid contact with the first bonding pads 120a, as shown in FIG. 4.

Figure 5:
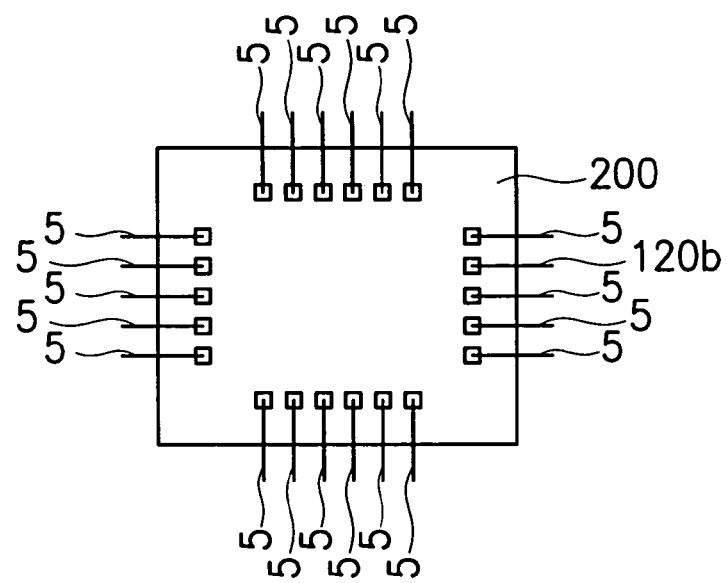
FIG. 5 is a top-view of the second level of the dual chips stacked packaging structure of FIG. 3.

The structure of FIG. 3 can be divided into two levels. The first level comprises the first chip 100, the chip paddle 300, and the leads 400 without the second chip 200, as shown in FIG. 4. The second level comprises the second chip 200, as shown in FIG. 5.

A plurality of leads 400 respectively corresponding to the bonding pads 120a, 120b are individually arranged beside the first chip 100 and the second chip 200. Each of the leads comprises a wire non-connecting surface II and a wire connecting surface I to connect with wires 140.

A second chip 200 comprises an active surface 200a and an opposing non-active surface 200b connecting with the second adhering surface 300b of the chip paddle 300. The active surface 200a of the second chip 200 consists of a central area and a peripheral area having a plurality of second bonding pads 120b. In particular, both the active surface 100a, 200a of the first chip 100 and the second chip 200 face the same direction.

Parts of the wires 140 electrically connect with the first bonding pad 120a and the leads 400, and parts of wires 140 electrically connect with the second bonding pad 120b and the leads 400. Moreover, the loop height of wires 140 between first bonding pads 120a and the leads 400 are lower than the top surface of the chip paddle 300, such that the wires 140 connecting with the first chip 100 cannot reach the second chip 200.

Second Embodiment

The dual chips stacked packaging structure of the present invention as described above can further be covered by an encapsulation to prevent machine or moisture damage. The encapsulation can cover the structure in several ways, described hereafter.

Figure 6:
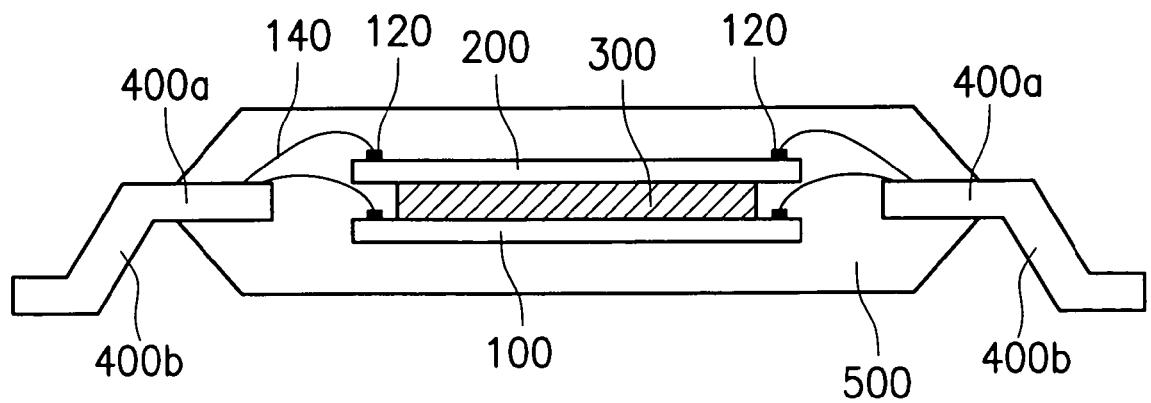
FIG. 6 is a cross-section of a dual chips stacked packaging structure according to a second embodiment of the invention, wherein the structure comprises an encapsulation.

In FIG. 6, an encapsulation 106 covers several elements of the semiconductor packaging structure described in the first embodiment, which, for brevity, is not illustrated here again. In the present embodiment, the first chip 100, the second chip 200, the chip paddle 300, the bonding pad 120, the wires 140, and the leads 400 are covered by the encapsulation 500. The leads can be totally covered by the encapsulation 500 and also extend beyond the encapsulation 500. The parts of the leads 400 covered by the encapsulation 106 are defined as inner leads 400a, and those extending beyond the encapsulation 106 as outer leads 400b.

Third Embodiment

Figure 7:
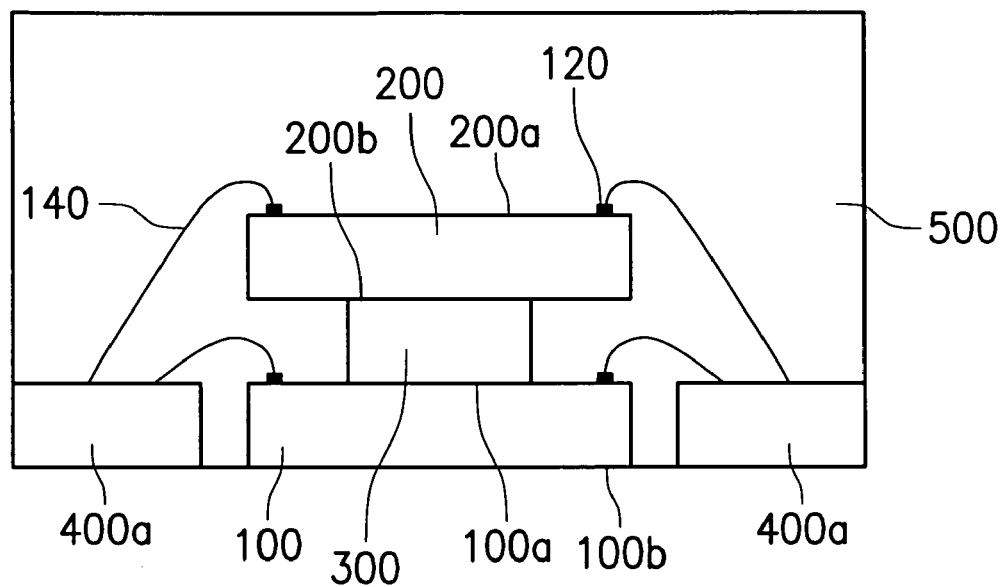
FIG. 7 is a cross-section of a dual chips stacked packaging structure according to a third embodiment of the invention, wherein the wire non-connecting surfaces of leads are entirely covered by the encapsulation.
Figure 8:
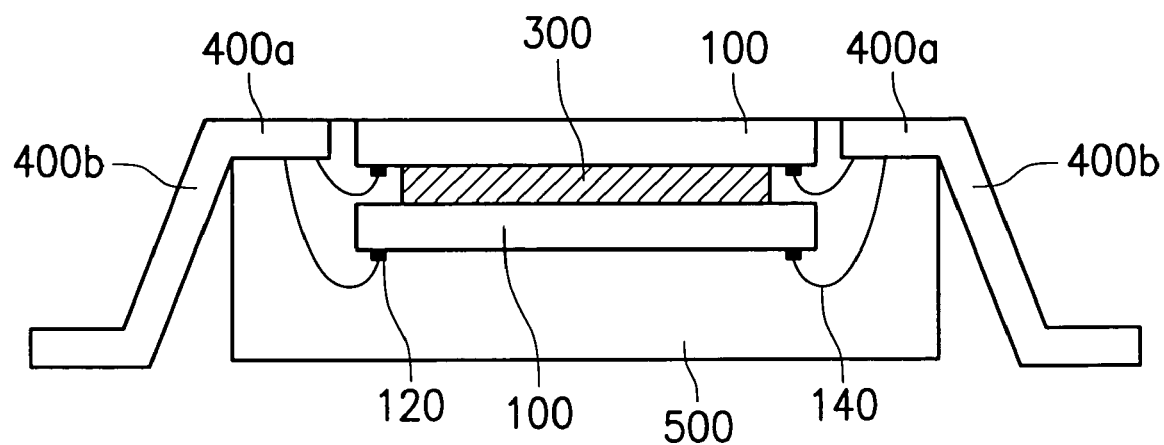
FIG. 8 is a cross-section of a dual chips stacked packaging structure according to the third embodiment of the invention, wherein the outer leads extend outside the encapsulation.

In FIGS. 7 and 8, the encapsulation 500 covers the dual chips stacked packaging structure described in the first embodiment, which, for brevity, is not illustrated here again.

In the present embodiment, the non-active surface 100b of the first chip 100 and the wire non-connecting surface of the leads 400 are exposed outside the encapsulation 500. The encapsulation 500 covers only the active surface 100a of the first chip 100, the second chip 200, the chip paddle 300, the bonding pad, and the wire connecting surface of the leads 400. Exposure of the non-connecting surface and the non-active surface further enhances heat dissipation.

The leads 400 can be completely covered by the encapsulation 500, as shown in FIG. 7, and also comprise the inner leads 400a covered by the encapsulation 500 and the outer leads 400b extending beyond the encapsulation 500, as shown in FIG. 8. The outer leads 400b are beneficial for second level packaging.

Accordingly, the present invention provides several advantages. First, the back of the chip (non-active surface) is exposed beyond the encapsulation to improve heat dissipation, enhancing reliability. Second, compared with the conventional structure, the total thickness of the semiconductor packaging structure of the present invention is significantly reduced, benefiting packaging processes. Third, both the active surface of the first chip and the second chip face the same direction, such that the first bonding pads and the second pads can be formed by the same design without different chips. Fourth, the dual chips stacked packaging structure is symmetrical, effectively improving reliability.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A dual chips stacked packaging structure, comprising:
   a first chip, having an active surface and an opposing non-active surface, the active surface consisting of a central area and a peripheral area having a plurality of first bonding pads;
   a lead frame, comprising a plurality of leads and a chip paddle having a first adhering surface and a second adhering surface, the first adhering surface adhered to the active surface of the first chip in such a way as to avoid contact with the first bonding pads;
   a second chip, having an active surface and an opposing non-active surface connecting with the second adhering surface of the chip paddle, the active surface consisting of a central area and a peripheral area having a plurality of second bonding pads, wherein the central area of the active surface of the first chip directly adheres to the first adhering surface of the chip paddle while an opposing central area of the opposing non-active surface of the second chip adheres to the second adhering surface of the chip paddle, and wherein the opposing central area of the opposing non-active surface of the second chip is opposite to the central area of the active surface of the second chip; and
   a plurality of wires, wherein parts of the wires electrically connect with the first bonding pad and the leads, and parts of the wires electrically connect with the second bonding pad and the leads.

2. The structure as claimed in claim 1, wherein the first adhering surface of the chip paddle and the active surface of the first chip are adhered by a non-conductive solid or liquid adhesive.

3. The structure as claimed in claim 1, wherein the second adhering surface of the chip paddle and the non-active surface of the second chip are connected by a solid or liquid adhesive.

4. The structure as claimed in claim 1, wherein the wires are metal lines.

5. A dual chips stacked packaging structure, comprising:
- a first chip, having an active surface and an opposing non-active surface, wherein the active surface consists of a central area and a peripheral area having a plurality of first bonding pads;
- a lead frame comprising a plurality of leads and a chip paddle having a first adhering surface and a second adhering surface, the first adhering surface adhered to the active surface of the first chip in such a way as to avoid contact with the first bonding pads;
- a second chip, having an active surface and an opposing non-active surface connecting with the second adhering surface of the chip paddle, wherein the active surface consists of a central area and a peripheral area having a plurality of second bonding pads, wherein the central area of the active surface of the first chip directly adheres to the first adhering surface of the chip paddle while an opposing central area of the opposing non-active surface of the second chip adheres to the second adhering surface of the chip paddle, and wherein the opposing central area of the opposing non-active surface of the second chip is opposite to the central area of the active surface of the second chip;
- a plurality of wires, parts of which electrically connect with the first bonding pad and the leads, and parts of which electrically connect with the second bonding pad and the leads; and
- an encapsulation, covering the lead frame, the first chip, the second chip, and the wires.

6. The structure as claimed in claim 5, wherein each lead further comprises an inner lead covered by the encapsulation and outer lead extending beyond the encapsulation.

7. The structure as claimed in claim 5, wherein the first adhering surface of the chip paddle and the active surface of the first chip are adhered by a non-conductive solid or liquid adhesive.

8. The structure as claimed in claim 5, wherein the second adhering surface of the chip paddle and the non-active surface of the second chip are connected by a solid or liquid adhesive.

9. The structure as claimed in claim 5, wherein the wires are metal lines.

10. A dual chips stacked packaging structure, comprising:
- a first chip, having an active surface and an opposing non-active surface, wherein the active surface consists of a central area and a peripheral area having a plurality of first bonding pads;
- a lead frame, comprising a plurality of leads and a chip paddle having a first adhering surface and a second adhering surface, the first adhering surface adhered to the active surface of the first chip in such a way as to avoid contact with the first bonding pads, and each of the leads comprising a wire connecting surface and an opposing wire non-connecting surface;
- a second chip, having an active surface and an opposing non-active surface connecting with the second adhering surface of the chip paddle, wherein the active surface consists of a central area and a peripheral area having a plurality of second bonding pads, wherein the central area of the active surface of the first chip directly adheres to the first adhering surface of the chip paddle while an opposing central area of the opposing non-active surface of the second chip adheres to the second adhering surface of the chip paddle, and wherein the opposing central area of the opposing non-active surface of the second chip is opposite to the central area of the active surface of the second chip;
- a plurality of wires, parts of which electrically connect with the first bonding pad and the wire connecting surface of the leads, and parts of which electrically connect with the second bonding pad and the wire connecting surface of the leads; and
- an encapsulation, covering the chip paddle, the second chip, the wire connecting surface of the leads, the active surface of the first chip, and the wires, with the non-active surface of the first chip and the total wire non-connecting surface of the leads exposed beyond the encapsulation.

11. The structure as claimed in claim 10, wherein each lead further comprises an inner lead covered by the encapsulation and outer lead extending beyond the encapsulation.

12. The structure as claimed in claim 11, wherein the non-active surface of the first chip exposed beyond the encapsulation remains exposed when the outer leads are attached to second level package.

13. The structure as claimed in claim 11, wherein the wire non-connecting surface of the leads remains exposed when the outer leads are attached to second level package.

14. The structure as claimed in claim 10, wherein the first adhering surface of the chip paddle and the active surface of the first chip are adhered by a non-conductive solid or liquid adhesive.

15. The structure as claimed in claim 10, wherein the second adhering surface of the chip paddle and the non-active surface of the second chip are connected by a solid or liquid adhesive.

16. The structure as claimed in claim 10, wherein the wires are metal lines.

17. The structure as claimed in claim 10, wherein the first and second chips adhere to either surface of the same parts of the chip paddle.

18. A dual chips stacked packaging structure, comprising:
- a first chip, having an active surface and an opposing non-active surface, wherein the active surface consists of a central area and a peripheral area having a plurality of first bonding pads;
- a lead frame, comprising a plurality of leads and a chip paddle having a first adhering surface and a second adhering surface, the first adhering surface adhered to the active surface of the first chip in such a way as to avoid contact with the first bonding pads, and each of the leads comprising a wire connecting surface and an opposing wire non-connecting surface;
- a second chip, having an active surface and an opposing non-active surface connecting with the second adhering surface of the chip paddle, wherein the active surface consists of a central area and a peripheral area having a plurality of second bonding pads, wherein the central area of the active surface of the first chip directly adheres to the first adhering surface of the chip paddle while an opposing central area of the opposing non-active surface of the second chip adheres to the second adhering surface of the chip paddle, and wherein the opposing central area of the opposing non-active surface of the second chip is opposite to the central area of the active surface of the second chip;
- a plurality of wires, parts of which electrically connect with the first bonding pad and the wire connecting surface of the leads, and parts of which electrically connect with the second bonding pad and the wire connecting surface of the leads; and an encapsulation, covering the chip paddle, the second chip, the wire connecting surface of the leads, the active surface of the first chip, and the wires, with the total wire non-connecting surface of the leads exposed beyond the encapsulation.

19. The structure as claimed in claim 18, wherein the first and second chips adhere to either surface of the same parts of the chip paddle.

20. The structure as claimed in claim 18, wherein each lead further comprises an inner lead covered by the encapsulation and outer lead extending beyond the encapsulation, and the wire non-connecting surface of the leads remains exposed when the outer leads are attached to an exterior device.

21. A dual chips stacked packaging structure, comprising:
a first chip, having an active surface and an opposing non-active surface, wherein the active surface consists of a central area and a peripheral area having a plurality of first bonding pads;
a second chip, having an active surface and an opposing non-active surface, wherein the non-active surface consists of a central area;
a lead frame, comprising a plurality of leads and a chip paddle having a first adhering surface and a second adhering surface, the second adhering surface adhered to the non-active surface of the second chip in such a way as to avoid contact with the second bonding pads, and each of the leads comprising a wire connecting surface and an opposing wire non-connecting surface, wherein the central area of the active surface of the first chip directly adheres to the first adhering surface of the chip paddle while the central area of the opposing non-active surface of the second chip adheres to the second adhering surface of the chip paddle;
a plurality of wires, parts of which electrically connect with the first bonding pad and the wire connecting surface of the leads, and parts of which electrically connect with the second bonding pad and the wire connecting surface of the leads; and
an encapsulation, covering the chip paddle, the first chip, the wire connecting surface of the leads, the non-active surface of the second chip, and the wires, with the total wire non-connecting surface of the leads exposed beyond the encapsulation.

22. The structure as claimed in claim 21, wherein the central area of the active surface of the first chip is opposite to the central area of the opposing non-active surface of the second chip.

23. The structure as claimed in claim 21, wherein each lead further comprises an inner lead covered by the encapsulation and outer lead extending beyond the encapsulation, and the wire non-connecting surface of the leads remains exposed when the outer leads are attached to an exterior device.

* * * * *